(12) United States Patent
Ishida et al.

(10) Patent No.: US 7,915,620 B2
(45) Date of Patent: Mar. 29, 2011

(54) LIGHT-EMITTING DEVICE, ELECTRONIC APPARATUS, AND LIGHT-EMITTING DEVICE MANUFACTURING METHOD

(75) Inventors: Yuichi Ishida, Kanagawa (JP); Kazuaki Yazawa, Tokyo (JP); Norikazu Nakayama, Saitama (JP)

(73) Assignee: Sony Corporation, Tokyo (JP)

( * ) Notice: Subject to any disclaimer, the term of this patent is extended or adjusted under 35 U.S.C. 154(b) by 31 days.

(21) Appl. No.: 12/369,463

(22) Filed: Feb. 11, 2009

(65) Prior Publication Data

US 2009/0218583 A1    Sep. 3, 2009

(30) Foreign Application Priority Data

Feb. 21, 2008   (JP) .................................. 2008-039830

(51) Int. Cl.
    *H01L 27/15* (2006.01)
(52) U.S. Cl. ............ 257/79; 257/77; 257/200; 257/201; 257/675; 257/E23.082; 257/E33.075
(58) Field of Classification Search .................. None
    See application file for complete search history.

(56) References Cited

U.S. PATENT DOCUMENTS

| 7,053,413 B2* | 5/2006 | D'Evelyn et al. ............... 257/79 |
| 2006/0076566 A1* | 4/2006 | Ikeda ............................... 257/79 |

FOREIGN PATENT DOCUMENTS

| JP | 05-235486 | 9/1993 |
| JP | 11-135846 | 5/1999 |
| JP | 2007-184587 | 7/2007 |
| JP | 2007-258753 | 10/2007 |
| JP | 2007-266574 | 10/2007 |
| JP | 2007-329465 | 12/2007 |

OTHER PUBLICATIONS

Japanese Patent Office Action corresponding to Japanese Serial No. 2008-039830 dated Dec. 8, 2009.

* cited by examiner

*Primary Examiner* — Minh-Loan T Tran
*Assistant Examiner* — Fei Fei Yeung Lopez
(74) *Attorney, Agent, or Firm* — SNR Denton US LLP

(57) ABSTRACT

Disclosed is a light-emitting device. The light-emitting device includes an EL layer and a heat dissipation layer. The EL layer includes a first semiconductor layer, a second semiconductor layer, and an active layer, the first semiconductor layer having a first conductivity type that is one of n type and p type, the second semiconductor layer having a second conductivity type that is opposite to the first conductivity type, the active layer being provided between the first semiconductor layer and the second semiconductor layer. The heat dissipation layer has the first conductivity type and is bonded to a side of the EL layer closer to the second semiconductor layer than the first semiconductor layer.

8 Claims, 8 Drawing Sheets

$$Q_1 = \alpha T_h I - \frac{RI^2}{2} + K(T_h - T_c) \qquad \text{Expression (1)}$$

$$Q_2 = -\alpha T_h I - \frac{RI^2}{2} + K(T_h - T_c) \qquad \text{Expression (2)}$$

$$\theta = \frac{T_h - T_c}{Q_1} \qquad \text{Expression (3)}$$

$$R = \rho \frac{L}{A} \qquad K = \kappa \frac{A}{L}$$

$\alpha$ : Seebeck coefficient

I : Current

R : Resistance $\rho$ : Resistivity

K : Heat conductance $\kappa$ : Heat conductivity

A : Cross-sectional area of crystal

L : Thickness of crystal

Th : Temperature on high-temperature side

Tc : Temperature on low-temperature side

FIG.10

LIGHT-EMITTING DEVICE, ELECTRONIC APPARATUS, AND LIGHT-EMITTING DEVICE MANUFACTURING METHOD

CROSS REFERENCES TO RELATED APPLICATIONS

The present invention contains subject matter related to Japanese Patent Application JP 2008-039830 filed in the Japanese Patent Office on Feb. 21, 2008, the entire contents of which being incorporated herein by reference.

BACKGROUND OF THE INVENTION

1. Field of the Invention

The present invention relates to a light-emitting device such as a light-emitting diode (LED) and a laser diode (LD), an electronic apparatus to which a light-emitting device is provided, and a method of manufacturing a light-emitting device.

2. Description of the Related Art

A light-emitting device such as a light-emitting diode and a laser diode is widely used for various kinds of lighting apparatuses, a backlight for a liquid crystal display, an outdoor large-screen display, and the like, and there is a demand for a light-emitting device that provides increased high power and high intensity.

Generally, the light-emitting device includes a light-emitting portion that is small in size, and an energy that does not contribute to light emission mostly converts to heat, so crystals of the light-emitting portion are likely to be damaged by heat. Therefore, heat should be positively diffused in order to implement the high-power, high-intensity light-emitting device.

For example, Japanese Patent Application Laid-open No. 2007-184587 (paragraph 0025, FIG. 1B) (hereinafter, referred to as Patent Document 1) discloses an optical assembly constituted of two semiconductor light-emitting devices (such as light-emitting diodes) and an active cooling device such as a thermoelectric cooler. During light emission by one of the semiconductor light-emitting devices, the active cooling device transmits heat generated due to the light emission to the other semiconductor light-emitting device, making it possible to maintain the two semiconductor light-emitting devices at desired temperatures.

SUMMARY OF THE INVENTION

However, in the optical assembly disclosed in Patent Document 1, it is necessary to supply power to the active cooling device from outside, and the optical assembly needs to be provided with the two semiconductor light-emitting devices. Therefore, a wiring for the active cooling device becomes necessary in addition to a wiring for supplying power to the semiconductor light-emitting devices. Further, due to its assembly structure, the devices are difficult to be independently used. If the cooling function can be integrally provided to the light-emitting device, and power for driving the light-emitting device can also be used for cooling, efficiency can be obtained.

In view of the above-mentioned circumstances, it is desirable to provide a light-emitting device, an electronic apparatus on which a light-emitting device is mounted, and a method of manufacturing a light-emitting device that are capable of effectively diffusing heat of a light-emitting portion with the use of power for driving itself.

According to an embodiment of the present invention, there is provided a light-emitting device. The light-emitting device includes an EL (Electro-Luminescence) layer and a heat dissipation layer. The EL layer includes a first semiconductor layer, a second semiconductor layer, and an active layer, the first semiconductor layer having a first conductivity type that is one of n type and p type, the second semiconductor layer having a second conductivity type that is opposite to the first conductivity type, the active layer being provided between the first semiconductor layer and the second semiconductor layer. The heat dissipation layer has the first conductivity type and is bonded to a side of the EL layer closer to the second semiconductor layer than the first semiconductor layer (for example, a side of the EL layer which is opposite to the side on which the first semiconductor layer is provided with respect to the active layer).

With this structure, a current that causes light emission in the EL layer is also supplied to the heat dissipation layer. The heat dissipation layer has the conductivity type that is different from the semiconductor layer bonded thereto, and therefore a direction in which a carrier (a hole or an electron) flows becomes a direction away from the EL layer. As a result, a Peltier effect (that causes heat to be transferred in the same direction as the carrier) generated in the heat dissipation layer causes heat to be transferred in the direction away from the EL layer. That is, the heat conduction of the heat dissipation layer and the heat transfer because of the Peltier effect enables effective heat dissipation. Thus, a high-power, high-intensity, light-emitting device can be implemented.

In the light-emitting device, the EL layer may include a conductive layer for reducing an electrical resistance due to a bias in a reverse direction in the second semiconductor layer and the heat dissipation layer, the conductive layer being disposed between the second semiconductor layer and the heat dissipation layer.

The EL layer and the heat dissipation layer are bonded to each other so that the second semiconductor layer of the EL layer and the heat dissipation layer have the different conductivity types. Therefore, when the EL layer is biased in a forward direction, a bonding portion of the EL layer and the heat dissipation portion are biased in the opposite direction. As a result, an electrical resistance is generated in the bonding portion of the EL layer and the heat dissipation layer.

By providing the conductive layer for reducing the electrical resistance to the light-emitting device, the electrical resistance due to the bias in the reverse direction can be reduced. That is, with this structure, heat generation due to the electrical resistance can be reduced, and heat generated in the EL layer is effectively transferred to the heat dissipation layer.

The light-emitting device further includes a first electrode bonded to the EL layer, and a second electrode bonded to the heat dissipation layer, to bias the EL layer in a forward direction between the first electrode and the second electrode.

In the light-emitting device, the heat dissipation layer may be a substrate for subjecting a crystal of at least the second semiconductor layer out of the active layer, the first semiconductor layer, and the second semiconductor layer to epitaxial growth.

With this structure, the substrate for subjecting the crystal to the epitaxial growth functions as the heat dissipation layer, which allows effective heat dissipation.

In the light-emitting device, the heat dissipation layer may be made of SiC.

SiC has a property similar to a predetermined crystalline material in terms of a lattice matching and a coefficient of thermal expansion, and has a high heat conductivity. Therefore, SiC used for the heat dissipation layer (and the substrate)

is used for the substrate for the epitaxial growth and can facilitate the heat dissipation of the light-emitting device because of the Peltier effect and the heat conduction thereof.

The light-emitting device may further include a substrate to subject a crystal of at least the second semiconductor layer out of the active layer, the first semiconductor layer, and the second semiconductor layer to epitaxial growth, the substrate being bonded to a side of the EL layer opposite to the side on which the heat dissipation layer is bonded.

With this structure, when a material of the heat dissipation layer is selected, a material having high heat dissipation effect can be selected irrespective of the property values such as a lattice constant and the coefficient of the heat expansion which relate to the epitaxial growth.

In the light-emitting device, the substrate may be made of sapphire.

Sapphire has a property similar to a predetermined crystalline material in terms of the lattice matching and the coefficient of the heat expansion, and facilitates the epitaxial growth. The heat dissipation layer is bonded to the EL layer that has been subjected to the epitaxial growth on the sapphire substrate, with the result that the light-emitting device having a high heat dissipation effect can be obtained.

According to another embodiment of the present invention, there is provided a light-emitting device. The light-emitting device includes an EL (Electro-Luminescence) layer and a conductive heat dissipation layer. The EL layer includes an n-type semiconductor layer, a p-type semiconductor layer, and an active layer provided between the n-type semiconductor layer and the p-type semiconductor layer. The conductive heat dissipation layer is bonded to a side of the EL layer closer to the n-type semiconductor layer than the p-type semiconductor layer.

Because the conductive heat dissipation layer is bonded to the side of the EL layer closer to the p-type semiconductor layer, when the EL layer is biased so as to be photoexcited, the electron moves in the direction away from the EL layer in the heat dissipation layer. That is, because of the Peltier effect, heat is transferred in the direction away from the EL layer in the heat dissipation layer, which allows the effective heat dissipation.

According to another embodiment of the present invention, there is provided a manufacturing method of a light-emitting device. The manufacturing method of a light-emitting device includes: forming, on a first substrate, an EL (Electro-Luminescence) layer in which a first semiconductor layer, an active layer, and a second semiconductor layer are laminated in the stated order, the first semiconductor layer having a first conductivity type that is one of n type and p type, the second semiconductor layer having a second conductivity type that is opposite to the first conductivity type; and bonding a second substrate that has the first conductivity type and functions as a heat dissipation layer on a side of the EL layer opposite to the side on which the first substrate is formed; and removing the first substrate.

In the manufacturing method, after the EL layer is formed on the first substrate, the second layer is bonded to the side of the EL layer opposite to the first substrate. Therefore, there is no need to form a crystal of the EL layer through the epitaxial growth on the second substrate and to take into consideration the property value of the heat dissipation layer relating to the epitaxial growth.

According to another embodiment of the present invention, there is provided an electronic apparatus. The electronic apparatus includes a light-emitting device. The light-emitting device includes an EL (Electro-Luminescence) layer including a first semiconductor layer, a second semiconductor layer, and an active layer, the first semiconductor layer having a first conductivity type that is one of n type and p type, the second semiconductor layer having a second conductivity type that is opposite to the first conductivity type, the active layer being provided between the first semiconductor layer and the second semiconductor layer, and a heat dissipation layer that has the first conductivity type and is bonded to a side of the EL layer closer to the second semiconductor layer than the first semiconductor layer.

These and other objects, features and advantages of the present invention will become more apparent in light of the following detailed description of best mode embodiments thereof, as illustrated in the accompanying drawings.

BRIEF DESCRIPTION OF DRAWINGS

FIG. 10 is a diagram showing expressions for calculating endothermic amounts and a thermal resistance.

DESCRIPTION OF PREFERRED EMBODIMENTS

Hereinafter, embodiments of the present invention will be described with reference to the drawings.

Figure 1:
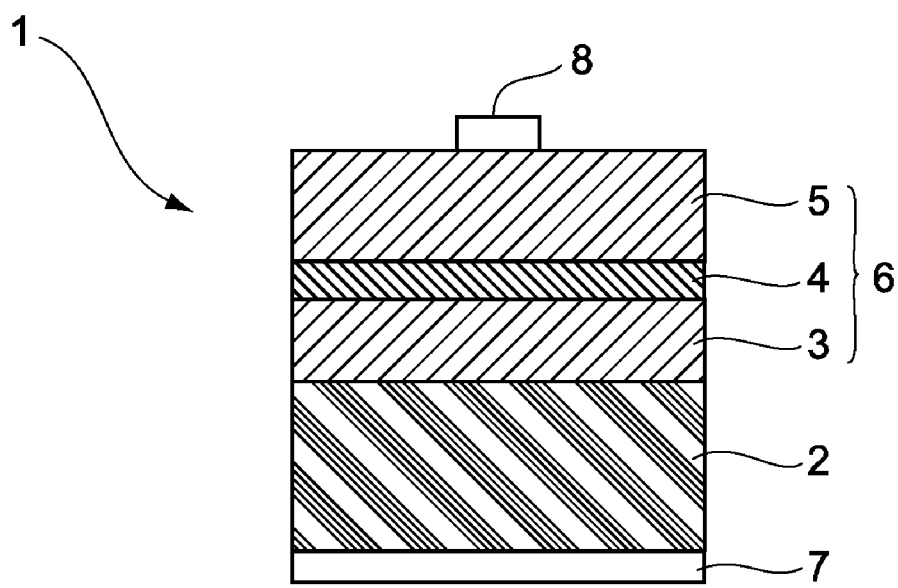
FIG. 1 is a schematic diagram showing a structure of a light-emitting device according to an embodiment of the present invention.

FIG. 1 is a schematic diagram showing a structure of a light-emitting device according to an embodiment of the present invention. In this embodiment, a description will be given by taking an LED (Light Emitting Diode) as an example of the light-emitting device.

As shown in FIG. 1, an LED 1 includes an EL (Electro-Luminescence) layer 6 and an n-type heat dissipation layer 2 bonded to the EL layer 6. The EL layer 6 includes a p-type semiconductor layer 3, an active layer 4, and an n-type semiconductor layer 5 that are laminated in the stated order from a side to which the heat dissipation layer 2 is bonded.

The LED 1 further includes a p electrode 7 bonded to the n-type heat dissipation layer 2 and an n electrode 8 bonded to the n-type semiconductor layer 5. To the p electrode 7 and the n electrode 8, a wiring and a power source (not shown) are connected. The heat dissipation layer 2 is bonded to a side of the EL layer 6 closer to the p-type semiconductor layer 3 than the n-type semiconductor layer 5. In this embodiment, as described later, the heat dissipation layer 2 is set to have an n-type conductivity, and the semiconductor layer closer to the heat dissipation layer 2 is set to have a p-type conductivity, which is opposite to the n-type conductivity of the heat dissipation layer 2.

The n-type heat dissipation layer 2 is made of n-type SiC, for example, and serves as a substrate for epitaxial growth of the EL layer 6. Although the substrate for the epitaxial growth is required to have properties similar to a crystalline material to be grown thereon in terms of lattice matching, a coefficient of thermal expansion, and the like, a substrate having a semiconductive property can be used as the heat dissipation layer in this embodiment, as long as the substrate is made of a material having a high thermal conductivity and a high Seebeck coefficient.

The p-type semiconductor layer 3 can be formed by subjecting, for example, GaN to the epitaxial growth, and causing GaN to have the p-type conductivity through electron beam irradiation or a thermal treatment.

The active layer 4 can be formed by subjecting a multiple quantum well structure formed of, for example, InGa/GaN to the epitaxial growth.

The n-type semiconductor layer 5 can be formed by subjecting, for example, n-type GaN to the epitaxial growth.

The epitaxial growths mentioned above can be conducted by a method appropriately selected from an organometallic epitaxy, a molecular beam epitaxy, and the like. It is only necessary that the respective layers hardly have lattice defects and have a uniform thickness.

Next, an operation of the LED 1 thus structured will be described.

When a current is supplied to the LED 1 in a forward direction (so as to set the n electrode 8 as a cathode) in the EL layer 6, an electron is supplied to the active layer 4 from the n-type semiconductor layer 5, and a hole is supplied to the active layer 4 from the p-type semiconductor layer 3, with the result that excitation light and heat are generated. That is, heat is generated from the EL layer 6, and is therefore conducted from the EL layer 6 to the p electrode 7 and the n electrode 8 having lower temperatures.

Further, a Peltier effect is caused when the current flows through the n-type heat dissipation layer 2. That is, a carrier (electron) in the heat dissipation layer 2 is moved away from the active layer 4, and at the same time, heat is transferred in the same direction.

In this way, in the n-type heat dissipation layer 2, the heat conduction and the heat transfer because of the Peltier effect are caused in a direction away from the active layer 4, which can effectively dissipate heat. As a result, damage to the active layer 4 due to heat can be suppressed, which contributes to implementation of the high-intensity, high-power LED 1.

In this embodiment, the conductivity of the heat dissipation layer 2 is set as n type, but may be p type. In this case, the heat dissipation layer 2 only has to be bonded to the n-type semiconductor layer of the EL layer 6. With this structure, a carrier (hole) in the heat dissipation layer 2 is moved away from the active layer, and thus the Peltier effect is caused in such a direction that heat is dissipated from the EL layer as described above.

Figure 2:
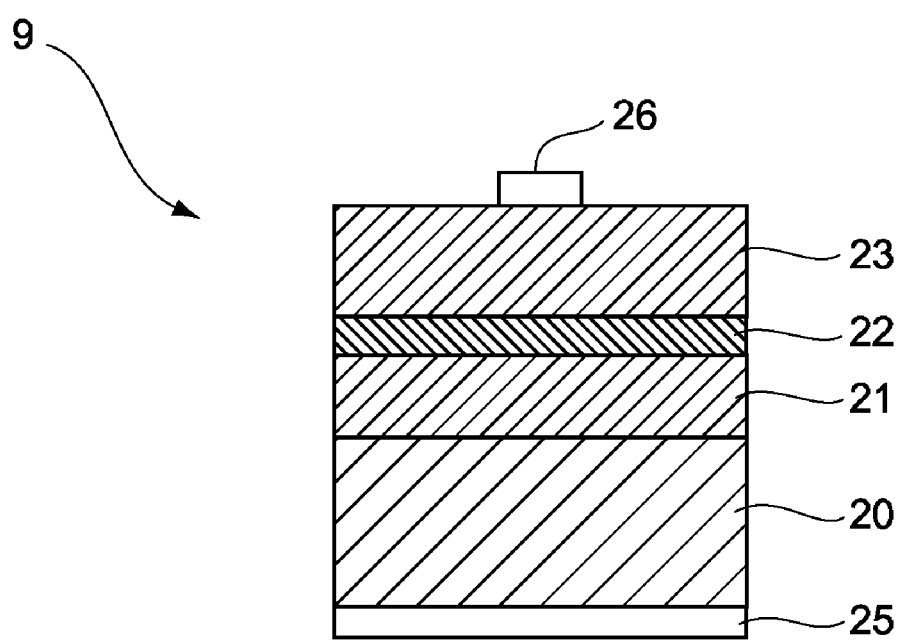
FIG. 2 is a diagram showing a typical structure of a GaN-based LED in practical use.

FIG. 2 is a diagram showing a typical structure of a GaN-based LED in practical use.

An LED 9 shown in FIG. 2 includes an n-SiC substrate 20, a p-GaN layer 21, an active layer 22, and a p-GaN layer 23. The p-GaN layer 21, the active layer 22, and the p-GaN layer 23 are laminated on the n-SiC substrate 20 in the stated order. The LED 9 further includes an n electrode 25 bonded to the n-SiC substrate 20 and a p electrode 26 bonded to the p-GaN layer 23.

When a current flows through the p-GaN layer 21, the active layer 22, and the p-GaN layer 23 in a forward direction (so as to set the n electrode 25 as a cathode), excitation light and heat are generated as described above, and the Peltier effect is caused in the n-SiC substrate 20. A carrier (electron) in the n-SiC substrate 20 is moved toward the active layer 22, and at the same time, heat is transferred in the same direction. The Peltier effect always exists irrespective of the Seebeck coefficient of SiC. A small Seebeck coefficient is less problematic, but a large Seebeck coefficient is significantly problematic.

That is, the Peltier effect is caused in the n-SiC substrate 20 in such a direction that heat is hindered from dissipating through the heat conduction, which lowers heat dissipation efficiency.

Figure 3:
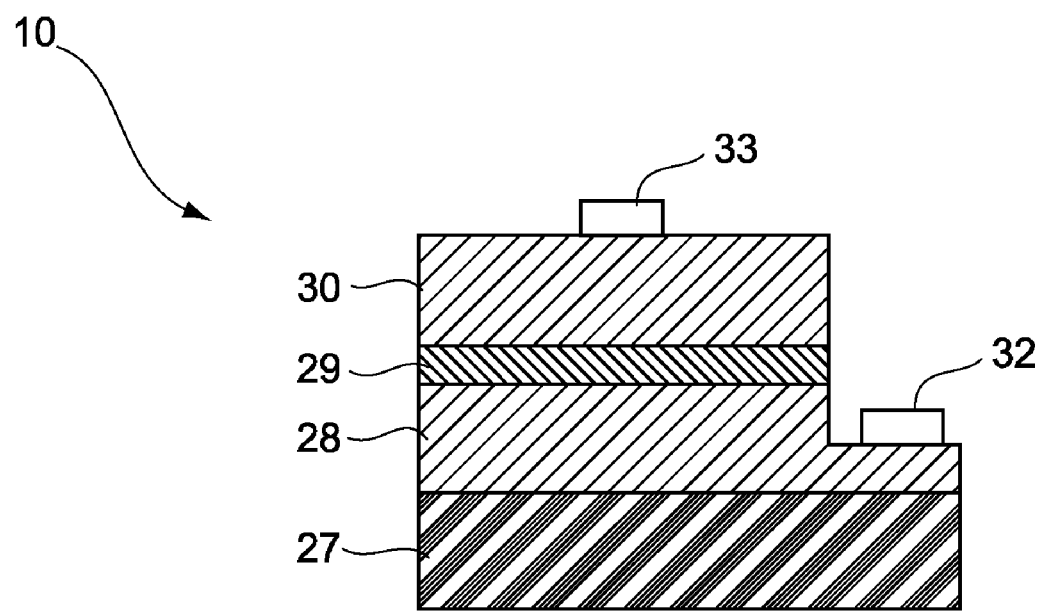
FIG. 3 is a diagram showing another typical structure of the GaN-based LED in practical use.

FIG. 3 is a diagram showing another typical structure of a GaN-based LED in practical use.

An LED 10 shown in FIG. 3 includes a sapphire substrate 27, a p-GaN layer 28, an active layer 29, and a p-GaN layer 30. The p-GaN layer 28, the active layer 29, and the p-GaN layer 30 are laminated on the sapphire substrate 27 in the stated order. The LED 10 further includes an n electrode 32 bonded to the p-GaN layer 28 and a p electrode 33 bonded to the p-GaN layer 30.

Sapphire is used for an epitaxial growth substrate for GaN, but does not have an electrical conductivity and has a poor heat conductivity, and therefore provides poor heat dissipation efficiency.

In contrast, the LED 1 according to this embodiment of the present invention positively utilizes the Peltier effect, and thus can provide high heat dissipation efficiency.

A light-emitting device according to another embodiment of the present invention will be described. In the following description, a description on the same constituents and functions as those provided to the LED 1 according to the above embodiment shown in FIG. 1 and the like will be simplified or omitted, and different points will be mainly described.

Figure 4:
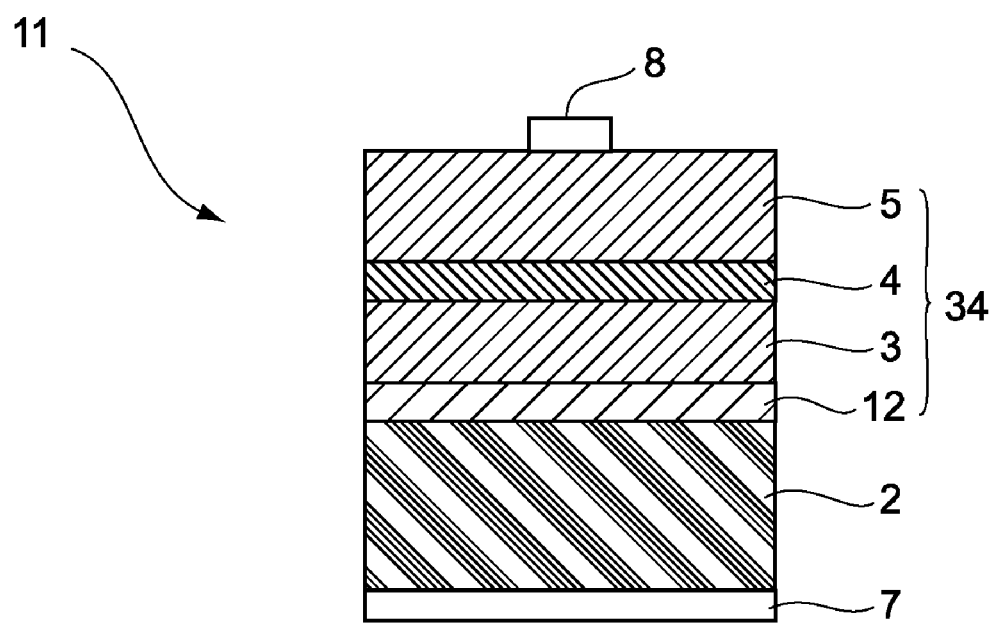
FIG. 4 is a schematic diagram showing a structure of a light-emitting device according to another embodiment of the present invention.

FIG. 4 is a schematic diagram showing a structure of a light-emitting device according to another embodiment of the present invention.

An LED 11 shown in FIG. 4 includes a conductive layer (conductive layer for lowering an electrical resistance) 12 between the p-type semiconductor layer 3 and the n-type heat dissipation layer 2.

The conductive layer 12 is made of Pt formed on the n-type heat dissipation layer 2 by sputtering, for example.

As the conductive layer 12, a low-temperature buffer layer (e.g., AlN layer previously formed for causing the epitaxial growth to desirably progress) in a case of subjecting the EL layer 34 to the epitaxial growth on the n-type heat dissipation layer 2 may be used. In this case, there is no need to additionally provide the conductive layer 12, so efficiency can be obtained.

Alternatively, a material for bonding the n-type heat dissipation layer 2 and the EL layer 34, such as solder, can be used as the conductive layer 12. In this case, the n-type heat dissipation layer 2 and the EL layer 34 are formed separately and bonded to each other. The conductive layer 12 (solder) has two functions of physical bonding and electrical bonding.

The material that forms the conductive layer 12 is not limited to the above, and may be another material as long as it is electrically conductive like metal and has a high heat conductivity.

The conductive layer 12 prevents generation of a depletion layer between the p-type semiconductor layer 3 and the n-type heat dissipation layer 2. Therefore, in the LED 11, even when a current flows in a forward direction (so as to set the n electrode 8 as the cathode) in the EL layer 34, an electrical resistance due to the depletion layer is not generated, and therefore heat is not generated.

Figure 5:
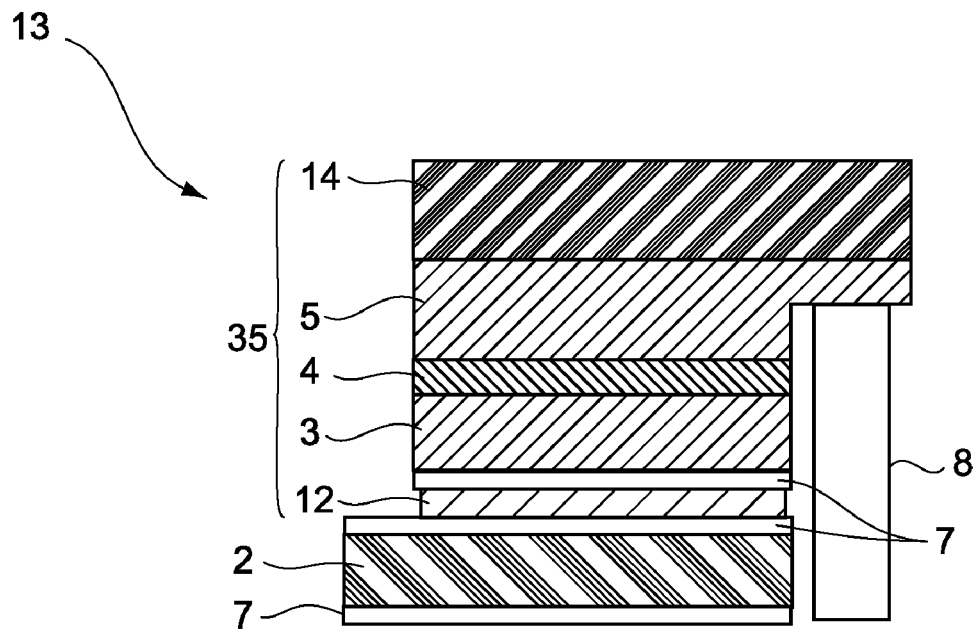
FIG. 5 is a schematic diagram showing a structure of a light-emitting device according to another embodiment of the present invention.

FIG. 5 is a schematic diagram showing a structure of a light-emitting device according to another embodiment of the present invention.

An LED 13 shown in FIG. 5 includes an EL layer 35, the n-type heat dissipation layer 2, and a crystal growth substrate 14. The n-type heat dissipation layer 14 functions as a submount and has a flip-chip structure.

The crystal growth substrate 14 is made of, for example, sapphire and serves as a substrate for the epitaxial growth of the EL layer 35. In this structure, since excitation light is obtained from the crystal growth substrate 14 side, the crystal growth substrate 14 needs to have a light transfer property. The n-type heat dissipation layer 2 is made of, for example, the n-type SiC and is bonded to the EL layer 35.

As described above, heat generated in the EL layer 35 is dissipated because of the heat conduction and the Peltier effect of the n-type heat dissipation layer 2, and can be further dissipated from the crystal growth substrate 14 through the heat conduction.

Figure 6:
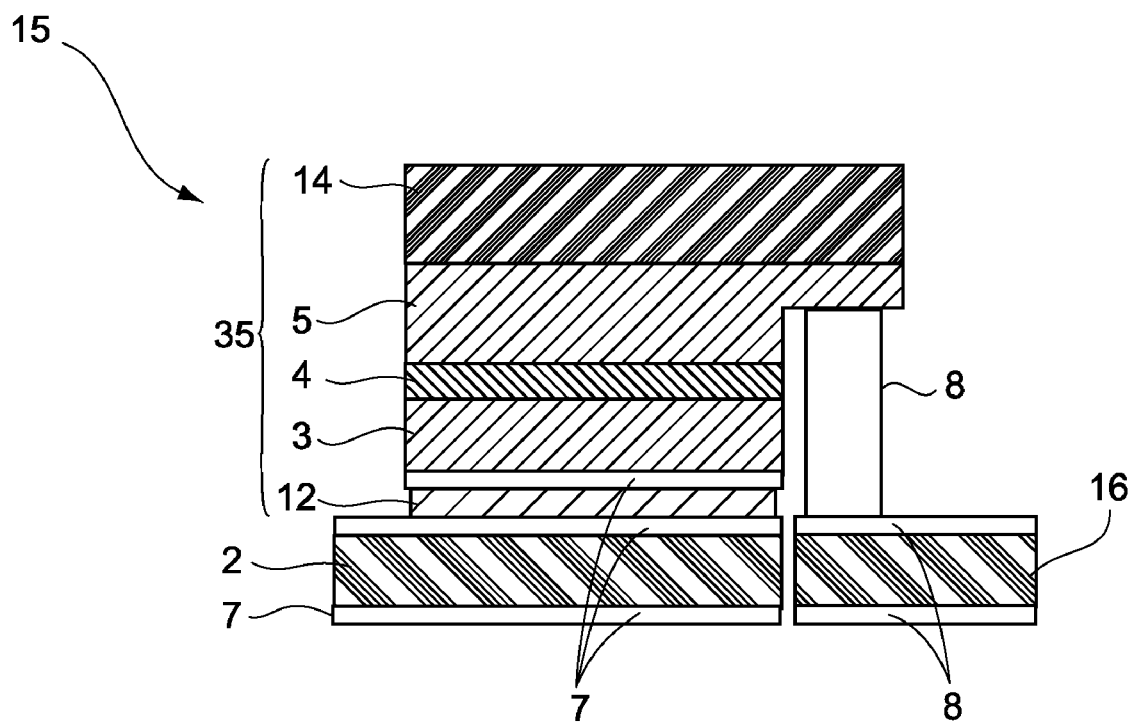
FIG. 6 is a schematic diagram showing a structure of a light-emitting device according to another embodiment of the present invention.

FIG. 6 is a schematic diagram showing a structure of a light-emitting device according to another embodiment of the present invention.

An LED 15 shown in FIG. 6 includes a p-type second heat dissipation layer 16, in addition to the structure of the LED 13 shown in FIG. 5. The second heat dissipation layer 16 has a different conductivity type (namely, p type) from the n-type semiconductor layer 5 connected through the electrode 8. The second heat dissipation layer 16 is made of p-type SiC, for example. The electrode 8 is desirably made of a material having a high heat conductivity.

A current that biases the EL layer 35 in the forward direction flows through the p-type second heat dissipation layer 16. A carrier (hole) in the p-type second heat dissipation layer 16 moves in a direction away from the electrode 8, and therefore heat of the electrode 8 is dissipated because of the Peltier effect. That is, heat generated in the EL layer 35 is conducted through the electrode 8 and dissipated from the p-type second heat dissipation layer. Further, heat is also dissipated from the n-type heat dissipation layer 2 and the crystal growth substrate 14, which allows more effective heat dissipation.

It should be noted that the conductive layer 12 may be eliminated as in the above embodiment shown in FIG. 1, although FIGS. 5 and 6 each show the structure in which a solder bonding layer (the conductive layer 12) is provided. For example, in the LED 13 shown in FIG. 5, the n-type heat dissipation layer 2 and the p-type semiconductor layer 3 may be bonded to each other.

In the above embodiments, the LED is used as an example of the light-emitting device. However, the light-emitting device according to the embodiments of the present invention is not limited to the LED. Hereinafter, a description will be given by using LD (Laser Diode) as an example of the light-emitting device.

Figure 7:
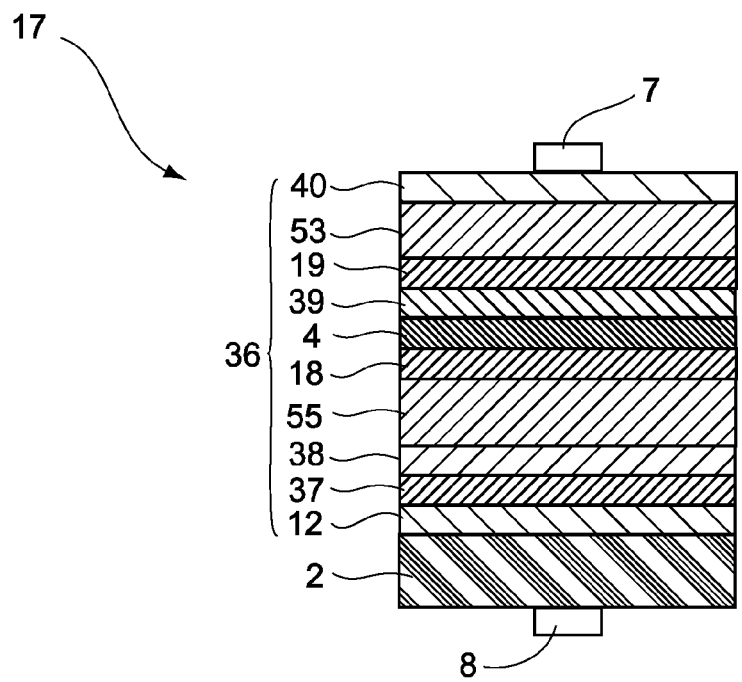
FIG. 7 is a schematic diagram showing a structure of an LD according to an embodiment of the present invention.

FIG. 7 is a schematic diagram showing a structure of an LD according to an embodiment of the present invention.

An LD 17 shown in FIG. 7 includes an EL layer 36 and the p-type heat dissipation layer 2 bonded to the EL layer 36. The EL layer 36 includes an n-type contact layer 37, a crack prevention layer 38, an n-type clad layer 55, an n-type light guide layer 18, the active layer 4, a p-type blocking layer 39, a p-type light guide layer 19, a p-type clad layer 53, and a p-type contact layer 40, which are laminated in the stated order from a side on which the p-type heat dissipation layer 2 is bonded. Further, the EL layer 36 is connected to the p-type heat dissipation layer 2 through the solder bonding layer (conductive layer 12).

The n-type contact layer 37 is formed of, for example, n-GaN, and provided for bring the EL layer 36 and the electrode (conductive layer 12 in this case) into contact with each other.

The crack prevention layer 38 is formed of, for example, n-InGaN, and provided for preventing a crack of the n-type clad layer 55.

The n-type light guide layer 18 is formed of, for example, n-GaN, and provided for reflecting excitation light generated in the active layer 4 and generating resonance.

The p-type blocking layer 39 is formed of, for example, p-AlGaN, and provided for preventing an electron from leaking to the p electrode side.

The p-type light guide layer 19 is formed of, for example, p-GaN, and provided for reflecting the excitation light generated in the active layer 4 and generating resonance.

The p-type contact layer 40 is formed of, for example, p-GaN, and provided for connecting the EL layer 36 to the electrode.

The n-type clad layer 55 is a superlattice clad layer made of n-AlGaN/GaN, and the p-type clad layer 53 is a superlattice clad layer made of p-AlGaN/GaN, for example.

The LD 17 further includes the n electrode 8 bonded to the p-type heat dissipation layer 2 and the p electrode 7 bonded to the p-type contact layer 40. To the p electrode 7 and the n electrode 8, a wiring and a power source (not shown) are connected.

In this embodiment, the heat dissipation layer 2 is set to have the p-type conductivity, and the clad layer closer to the heat dissipation layer 2 is set to have the conductivity opposite to the heat dissipation layer 2, i.e., the n-type conductivity.

When a current flows through the LD 17 in the forward direction (so as to set the n electrode 8 as the cathode) in the EL layer 36, an electron is injected into the active layer 4 from the n-type clad layer 55 and a hole is injected into the active layer 4 from the p-type clad layer 53, which generates excitation light. The excitation light is resonated in the p-type light guide layer 19 and the n-type light guide layer 18 and released as laser light.

Heat generated along with this is dissipated through heat conduction from the EL layer 36 to the p electrode 7 and the n electrode 8 which have lower temperatures than the EL layer 36.

In addition, the current that flows through the EL layer 36 causes the Peltier effect when flowing through the heat dissipation layer 2. That is, the carrier (hole) in the p-type heat dissipation layer 2 is moved away from the active layer 4, and at the same time, heat is transferred in the same direction.

As described above, in the p-type heat dissipation layer 2, the heat conduction and the heat transfer because of the Peltier effect are caused in the direction away from the active layer 4, making it possible to effectively dissipate heat. As a result, damage to the active layer 4 due to heat can be suppressed, which contributes to implementation of high-intensity, high-power LD 17.

Figure 8:
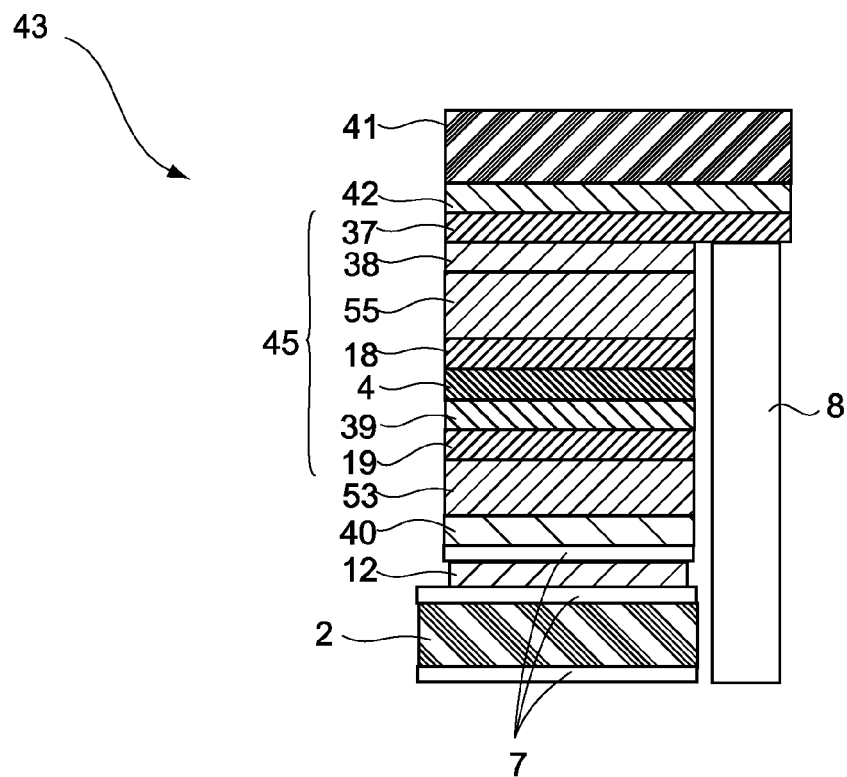
FIG. 8 is a schematic diagram showing a structure of an LD according to another embodiment of the present invention.

FIG. 8 is a schematic diagram showing a structure of an LD according to another embodiment of the present invention.

An LD 43 shown in FIG. 8 includes an EL layer 45, the n-type heat dissipation layer 2, a crystal growth substrate 41, and a low-temperature buffer layer 42 for the epitaxial growth of the EL layer 45 on the crystal growth substrate 41. The EL layer 45 includes the n-type contact layer 37, the clack prevention layer 38, the n-type clad layer 55, the n-type light guide layer 18, the active layer 4, and the p-type blocking layer 39, the p-type light guide layer 19, the p-type clad layer 53, and the p-type contact layer 40.

As described above, heat generated in the EL layer 45 is dissipated through the heat conduction and because of the Peltier effect in the n-type heat dissipation layer 2, and can also be dissipated from the crystal growth substrate 41 and the n electrode 8 through the heat conduction.

Figure 9:
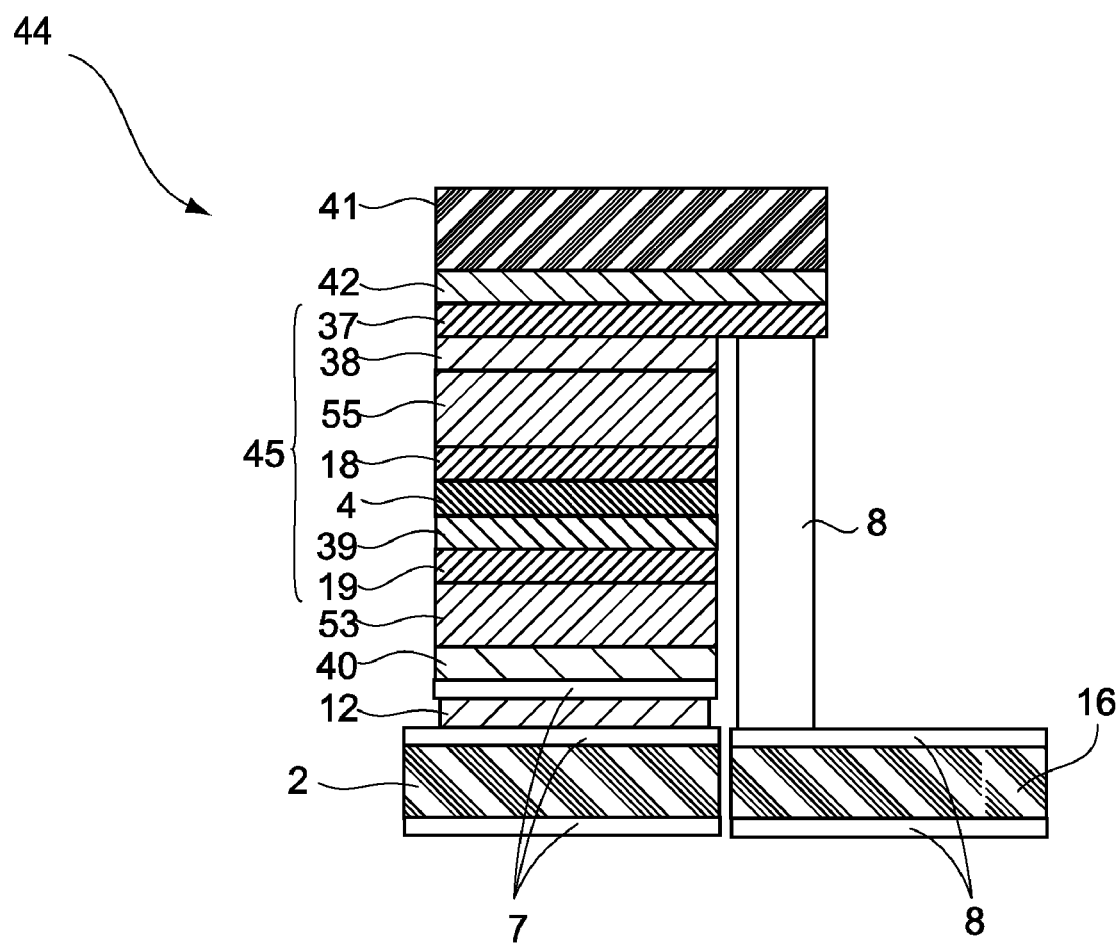
FIG. 9 is a schematic diagram showing a structure of an LD according to another embodiment of the present invention.

FIG. 9 is a schematic diagram showing a structure of an LD according to another embodiment of the present invention.

An LD 44 shown in FIG. 9 includes the p-type second heat dissipation layer 16, in addition to the structure of the LD 43 shown in FIG. 8. The second heat dissipation layer 16 has the p-type conductivity.

As described above, heat generated in the EL layer 45 is effectively dissipated because of the Peltier effect in the n-type heat dissipation layer 2 and the p-type second heat dissipation layer 16.

Here, a description will be given on formation of the GaN-based compound semiconductor layer by the epitaxy mentioned above.

For forming the GaN-based compound semiconductor layer, an MOCVD (Metal Organic Chemical Vapor Deposition) method is used.

The crystal growth substrate is formed of, for example, p-type 4H-SiC, and a conductive layer is formed on the substrate. The conductive layer may be made of metal or a highly-doped semiconductor.

Herein, a Pt (III) layer is formed by the sputtering method. Next, the layers are laminated by the MOCVD method.

As materials used for the MOCVD, trimethylgallium (TMGa) or triethylgallium (TEGa) as a Ga source, trimethylindium (TMIn) as an In source, trimethylaluminum (TMAl) as an Al source, an ammonia gas as an N source, silane ($SiH_4$) as a Si source that is an n-type impurity, and bis-cyclopentadiethyl magnesium $((C_2H_5)_2Mg)$ as a Mg source that is a p-type impurity are used.

For example, a GaN:Si layer (2000 nm), a $Ga_{0.8}In_{0.2}P$—GaN MQW (multiple-quantum well) layer (300 nm), a GaN:Mg layer, and an Au/Ni/Mg electrode are formed.

In a specific structure (LED (in which the heat dissipation layer is made of SiC)) of the light-emitting device according to the embodiment of the present invention shown in FIG. 4, an endothermic amount $Q_1$ of the heat dissipation layer is represented by Expression (1) shown in FIG. 10.

In Expression (1), a first term denotes a heat flux brought by the Peltier effect, a second term denotes a heat flux brought by Joule heat generation, and a third term denotes a heat flux brought by the heat conduction.

On the other hand, an endothermic amount $Q_2$ of the n-SiC substrate 20 of the LED 9 of the structure in related art shown in FIG. 2 is represented by Expression (2) shown in FIG. 10.

The following parameters are substituted into Expressions (1) and (2) to calculate the endothermic amounts $Q_1$ and $Q_2$.

$\alpha_{SiC}$=4.00*10$^{-4}$(V/K), $\rho_{SiC}$=5.00*10$^{-4}$($\Omega$m), $\kappa_{SiC}$=400 (W/mK), $L$=1*10$^{-4}$(m), $A$=1*10$^{-6}$(m$^2$), $T_h$=351 (K), $T_c$=350(K)

Further, for comparison, a case where Cu is used in place of the n-SiC substrate 20 in the LED 9 having the past structure shown in FIG. 2 will be considered. The following parameters are substituted into Expression (2), to calculate an endothermic amount $Q_3$ in this case. The calculation results are shown in FIG. 11.

$\alpha_{Cu}$=1.83*10$^{-6}$(V/K), $\rho_{Cu}$=1.70*10$^{-8}$($\Omega$m), $\kappa_{Cu}$=400 (W/mK)

Figure 11:
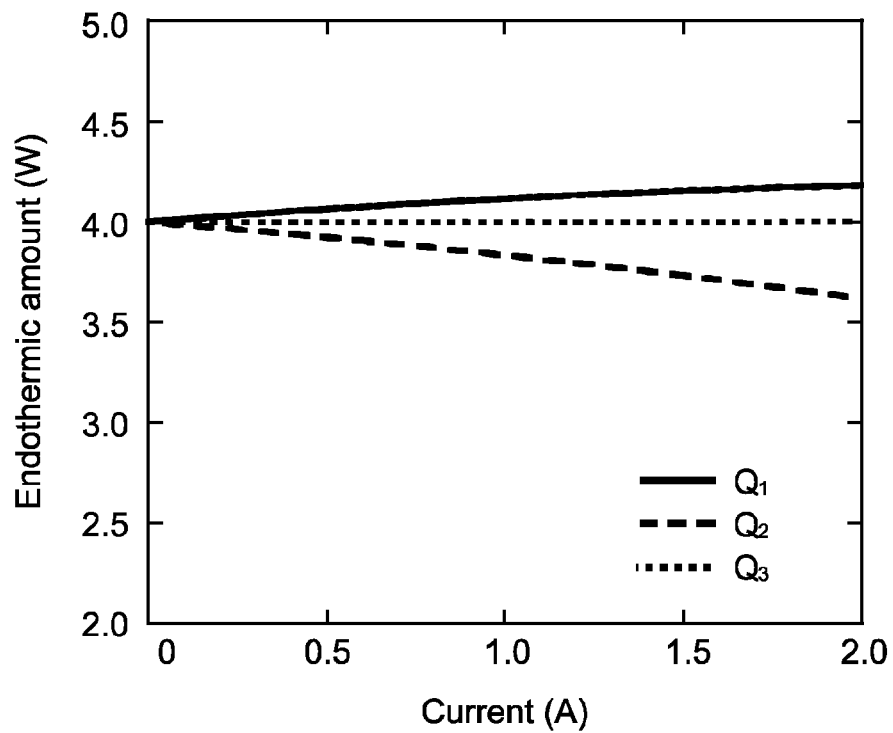
FIG. 11 is a diagram showing a representation in which the endothermic amounts of the respective light-emitting devices are plotted with respect to currents.

As shown in FIG. 11, with the structure of the light-emitting device according to the embodiment of the present invention, a larger amount of heat than the case of using the past structure can be dissipated, and further effectiveness is obtained as compared to the case of using copper as a typical heat dissipation material. That is, with the structure of the light-emitting device according to the embodiment of the present invention, a larger amount of currents can be supplied to the light-emitting device, and higher intensity can be obtained.

Figure 12:
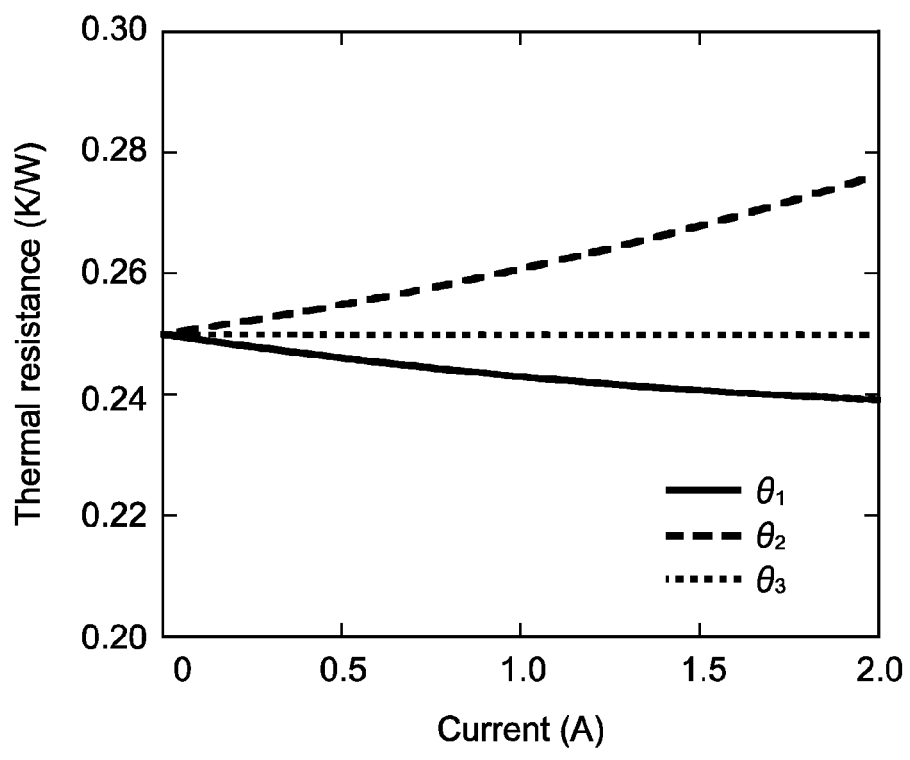
FIG. 12 is a diagram showing a representation in which the thermal resistances of the respective light-emitting devices are plotted with respect to currents.

Further, with Expression (3) shown in FIG. 10, a thermal resistance $\theta$ of each structure described above is calculated, and calculation results are shown in FIG. 12.

FIG. 12 reveals that the structure of the light-emitting device according to the embodiment of the present invention has a thermal resistance ($\theta_1$) smaller than a thermal resistance ($\theta_2$) of the past structure and a thermal resistance ($\theta_3$) of the structure using copper.

Next, a manufacturing method of the light-emitting device according to an embodiment of the present invention will be described.

FIG. 13 are diagrams showing a manufacturing method of the light-emitting device according to the embodiment of the present invention. With reference to FIG. 13, an example of the manufacturing method of the LED 11 shown in FIG. 4 will be described.

Figure 13A:
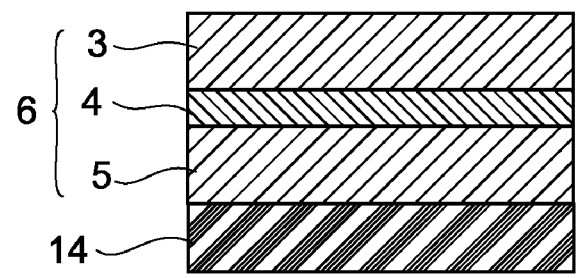
FIG. 13 are diagrams showing a manufacturing method of the light-emitting device according to an embodiment of the present invention.

As shown in FIG. 13A, the n-type semiconductor layer 5, the active layer 4, and the p-type semiconductor layer 3 are successively laminated on the crystal growth substrate 14 through the epitaxial growths as described above, for example, to thereby form the EL layer 6. As the crystal growth substrate 14, a material having such a property value that the epitaxial growths are facilitated only needs to be used. For example, the crystal growth substrate 14 may be formed of the sapphire substrate, but is not limited to this. In addition, on the crystal growth substrate 14, a low-temperature buffer layer or the like for facilitating crystallization may be formed in advance.

Figure 13B:
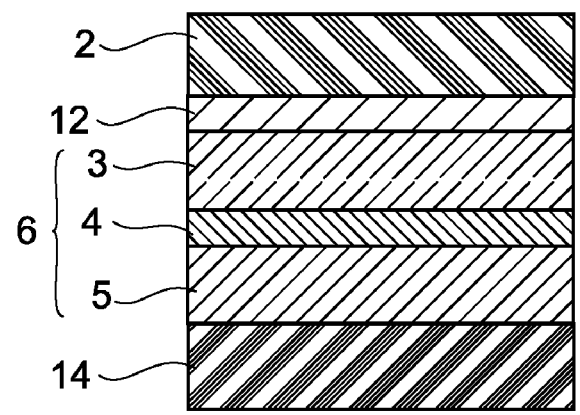

Next, as shown in FIG. 13B, the n-type heat dissipation layer 2 is bonded to a side of the EL layer 6 opposite to the crystal growth substrate 14 with a bonding adhesive having a conductivity, which forms the conductive layer 12.

Figure 13C:
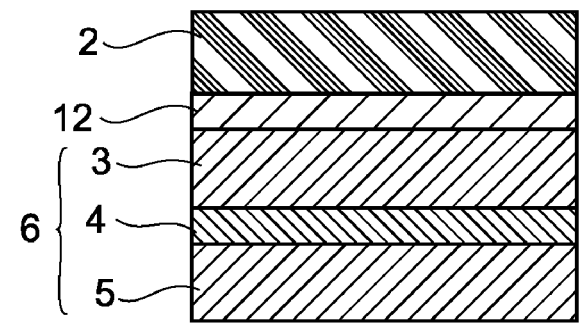

Next, as shown in FIG. 13C, the crystal growth substrate 14 is removed by a method such as a laser lift-off and a chemical lift-off.

As described above, components of the LED 11 other than the electrodes 7 and 8 are manufactured.

By the above-described manufacturing method, it is not necessary that the material of the heat dissipation layer 2 have such a property value as to contribute to the epitaxial growth. Therefore, the number of options of the material of the heat dissipation layer 2 is increased. By selecting a material of the heat dissipation layer 2 that provides high heat dissipation efficiency, a light-emitting device having high heat dissipation efficiency can be manufactured.

The present invention is not limited to the above embodiments, and various modifications can of course be made without departing from the gist of the present invention.

For example, the present invention can be applied to a blue GaN-based LED, a green GaN-based LED, a red GaAs-based LED, a blue GaN-based LD, a red GaAs-based LD, and the like.

Of course, the present invention can also be applied to a white LED obtained by packing red, green, blue LEDs into one chip, and a white LED obtained by mounting the blue GaN-based LED and a phosphor thereon as a chip.

Further, the present invention can also be applied to an intrinsic EL device (so-called thin-film EL device such as an organic EL device and an inorganic EL device) in addition to the injection EL device like the LEDs 1, 11, 13, and 15, and the LDs 17, 43, and 44.

Examples of the material of the heat dissipation layer 2 described in the above embodiments include, in addition to SiC, the following materials having high heat conductivities, high Seebeck coefficients, and high electrical conductivities:
(1) Si, Ge,
(2) a carbon system such as carbon nanotube, fullerene, graphite, diamond, and diamond-like carbon (each of which may have an array-like shape or a film-like shape),
(3) a carbide system such as WC, ZrC, and TiC (including SiC),
(4) a nitride system such as GaN, TiN, and ZrN,
(5) a silicide system such as $FeSi_2$, $MnSi_2$, and $CrSi_2$,
(6) a metal system such as Ni, Fe, and Co, and
(7) an alloy system such as a Ni—Cu alloy (including constantan), a Ni—Cr alloy (including chromel), and a Ni—Al alloy (including alumel).

Of course, a material obtained by doping an appropriate element to each main material of the above items (1) to (7) can be included.

In a case where a heat dissipation layer having a high conductivity (conductive heat dissipation layer) is used as the heat dissipation layer, the conductive heat dissipation layer is bonded to a side of the EL layer closer to the p-type semiconductor layer than the n-type semiconductor layer. With this structure, when, for example, the EL layer is biased so as to be photoexcited, an electron is moved in a direction away from the EL layer in the heat dissipation layer. That is, because of the Peltier effect, in the heat dissipation layer, heat is transferred in the direction away from the EL layer, resulting in effective heat dissipation.

Examples of an electronic apparatus to which the LED 1, 11, 13, 15, or 17, or the LD 17, 43, or 44 according to the above embodiments is provided include: a computer (such as a laptop computer, a desktop computer, and a server computer in a case of a personal computer), a PDA (Personal Digital Assistant), an electronic dictionary, a camera, a display, audiovisual equipment, a projector, a mobile phone, a gaming machine, a car navigation system, a robot, and other electrical appliances. Further, the LEDs and LDs according to the above embodiments can be applied to various kinds of displays that are used not only indoors but also outdoors and in public facilities.

What is claimed is:

1. A light-emitting device, comprising:
   an EL (Electro-Luminescence) layer including a first semiconductor layer, a second semiconductor layer, and an active layer, the first semiconductor layer having a first conductivity type that is one of n type and p type, the second semiconductor layer having a second conductivity type that is opposite to the first conductivity type, the active layer being between the first semiconductor layer and the second semiconductor layer; and
   a heat dissipation layer that has the first conductivity type and is bonded to a side of the EL layer closer to the second semiconductor layer than the first semiconductor layer to reduce heat,
   wherein,
      the EL layer further includes a conductive layer for reducing an electrical resistance due to a bias in a reverse direction in the second semiconductor layer and the heat dissipation layer, the conductive layer being disposed between the second semiconductor layer and the heat dissipation layer.

2. The light-emitting device according to claim 1, further comprising:
   a first electrode bonded to the EL layer; and
   a second electrode bonded to the heat dissipation layer, to bias the EL layer in a forward direction between the first electrode and the second electrode.

3. The light-emitting device according to claim 1,
   wherein the heat dissipation layer is a substrate for subjecting a crystal of at least the second semiconductor layer out of the active layer, the first semiconductor layer, and the second semiconductor layer to epitaxial growth.

4. The light-emitting device according to claim 1,
   wherein the heat dissipation layer is made of SiC.

5. The light-emitting device according to claim 1, further comprising:
   a substrate to subject a crystal of at least the second semiconductor layer out of the active layer, the first semiconductor layer, and the second semiconductor layer to epitaxial growth, the substrate being bonded to a side of the EL layer opposite to the side on which the heat dissipation layer is bonded.

6. The light-emitting device according to claim 5,
   wherein the substrate is made of sapphire.

7. A light-emitting device, comprising:
   an EL (Electro-Luminescence) layer including an n-type semiconductor layer, a p-type semiconductor layer, and an active layer between the n-type semiconductor layer and the p-type semiconductor layer; and
   a conductive heat dissipation layer bonded to a side of the EL layer closer to the p-type semiconductor layer than the n-type semiconductor layer,
   wherein,
      the EL layer further includes a conductive layer for reducing an electrical resistance due to a bias in a reverse direction in the second semiconductor layer and the heat dissipation layer, the conductive layer being disposed between the second semiconductor layer and the heat dissipation layer.

8. An electronic apparatus, comprising:
   a light-emitting device including:
      an EL (Electro-Luminescence) layer including a first semiconductor layer, a second semiconductor layer, and an active layer, the first semiconductor layer having a first conductivity type that is one of n type and p type, the second semiconductor layer having a second conductivity type that is opposite to the first conductivity type, the active layer being between the first semiconductor layer and the second semiconductor layer, and
      a heat dissipation layer that has the first conductivity type and is bonded to a side of the EL layer closer to the second semiconductor layer than the first semiconductor layer,
   wherein, the EL layer further includes a conductive layer for reducing an electrical resistance due to a bias in a reverse direction in the second semiconductor layer and the heat dissipation layer, the conductive layer being disposed between the second semiconductor layer and the heat dissipation layer.

* * * * *